(12) United States Patent
Holbery et al.

(10) Patent No.: US 9,872,390 B1
(45) Date of Patent: Jan. 16, 2018

(54) FLEXIBLE INTERCONNECT (71) Applicant: Microsoft Technology Licensing, LLC, Redmond, WA (US)

(72) Inventors: James David Holbery, Bellevue, WA (US); Siyuan Ma, Bothell, WA (US); Michael David Dickey, Redmond, WA (US); Andrew L. Fassler, Pittsburgh, PA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/239,645

(22) Filed: Aug. 17, 2016

(51) Int. Cl.
| | |
|---|---|
| H05K 1/09 | (2006.01) |
| H05K 1/03 | (2006.01) |
| H01R 4/58 | (2006.01) |
| H05K 1/14 | (2006.01) |
| H05K 1/02 | (2006.01) |
| H05K 3/10 | (2006.01) |
| H05K 3/28 | (2006.01) |

(52) U.S. Cl.
CPC ............ *H05K 1/14* (2013.01); *H05K 1/0296* (2013.01); *H05K 1/0393* (2013.01); *H05K 3/107* (2013.01); *H05K 3/28* (2013.01); *H05K 2201/032* (2013.01); *H05K 2201/0391* (2013.01); *H05K 2201/10977* (2013.01); *H05K 2203/1305* (2013.01)

(58) Field of Classification Search
CPC ...... H05K 1/14; H05K 1/0393; H05K 1/0391; H05K 2201/10977; H05K 2203/1305
USPC .................... 174/255, 257; 439/86
See application file for complete search history.

(56) References Cited

U.S. PATENT DOCUMENTS

| | | | | |
|---|---|---|---|---|
| 5,757,615 | A | * 5/1998 | Donahoe | G06F 1/203 165/104.33 |
| 8,486,833 | B2 | 7/2013 | Bruzewicz et al. | |
| 9,116,145 | B2 | 8/2015 | Li et al. | |
| 2002/0086566 | A1 * | 7/2002 | Simons | H01R 4/04 439/86 |

FOREIGN PATENT DOCUMENTS

| | | |
|---|---|---|
| CN | 10444505 A | 3/2015 |
| CN | 104445055 A * | 3/2015 |

OTHER PUBLICATIONS

Venere, Emil, "Inkjet-printed liquid metal could bring wearable tech, soft robotics", Published on: Apr. 7, 2015 Available at: http://www.purdue.edu/newsroom/releases/2015/Q2/inkjet-printed-liquid-metal-could-bring-wearable-tech,soft-robotics.html.

Larmagnac, et al., "Stretchable electronics based on Ag-PDMS composites", In Journal of Scientific Reports, vol. 4, Article No. 7254, Dec. 1, 2014, pp. 1-7.

(Continued)

*Primary Examiner* — Sherman Ng
(74) *Attorney, Agent, or Firm* — Alleman Hall Creasman & Tuttle LLP (57) ABSTRACT

One example provides a flexible electrical interconnect comprising a substrate, a liquid conductive pathway supported by the substrate, and a conductively anisotropic, magnetic particle-embedded encapsulant that interfaces with the liquid conductive pathway for connecting to another circuit element.

18 Claims, 7 Drawing Sheets

(56) References Cited

OTHER PUBLICATIONS

Zhu, et al., "Ultrastretchable Fibers with Metallic Conductivity Using a Liquid Metal Alloy Core", In Publication of Wiley-VCH Verlag GmbH—Advanced Functional Materials, vol. 23, Issue 18, May 13, 2013, pp. 1-7.

Joshipura, I. et al., "Methods to pattern liquid metals," Journal of Materials Chemistry C, vol. 3, No. 16, Apr. 28, 2015, Published Online Mar. 31, 2015, 8 pages.

* cited by examiner

FLEXIBLE INTERCONNECT

BACKGROUND

Flexible electrical interconnects may be used to connect electronic components located in portions of a device that are moveable relative to one another. In such a device, a flexible interconnect may be subject to a large number of flexing cycles over a lifetime of the device, and thus may be susceptible to damage.

SUMMARY

Examples are disclosed that relate to flexible electrical interconnects. One example provides an interconnect including a substrate, a liquid conductive pathway supported by the substrate, and a conductively anisotropic, magnetic particle-embedded encapsulant that interfaces with the liquid conductive pathway for connecting to another circuit element.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Electrical interconnects may be incorporated into a variety of devices to provide electrical pathways between device components. Some electronic devices may include joints, hinges, and/or other moveable structures that connect two parts each having electronic components. In such structures, a flexible interconnect may be utilized to bridge the components to allow the components to remain electrically interconnected as the components are moved relative to one another.

Flexible interconnects are commonly formed from solid metal traces, such as copper, patterned on a flexible substrate, such as a polyimide film. However, the solid metal traces may fatigue over time after repeated flexing, which may lead to breakage of the traces, thereby disrupting the electrical connection between the components. Even solid metal traces that are able to withstand a high number of flex cycles may fail due to pinch points, strain, twist, and/or other modes of deformation.

To address such problems, liquid metal conductors embedded in flexible encapsulant materials may be used to form electrical pathways between the components. The use of a liquid metal conductor in a flexible circuit element may help to resist circuit breakage from repeated flexing and/or other modes of deformation of the circuit element compared to interconnects that use only solid metal traces, even when repeatedly bent to high angles (e.g. approximately 180 degrees in either direction) or deformed with a high and/or concentrated level of force, as the ability for the liquid metal to flow imparts self-healing characteristics to such an interconnect. The liquid metal conductor may be used alone, or may be used in combination with a solid metal trace on which the liquid metal conductor is deposited.

However, forming electrical connections through the encapsulant between the liquid metal conductor and other circuit elements may pose challenges. For example, if pins (e.g. integrated circuit pins) or wires are extended through an encapsulant that encloses the liquid metal, the pins or wires may serve as a point of weakness, potentially allowing liquid metal conductor to escape.

Accordingly, examples are disclosed that relate to forming electrically conductive paths between an encapsulated liquid metal conductor and an exterior of the encapsulant to connect to the liquid metal to other electrical components. In one example, a flexible interconnect with a liquid conductor utilizes an encapsulant that comprises magnetically aligned conductive particles which form conductive pathways from the liquid metal conductor to connect to exterior circuit elements. As described in more detail below, the magnetic particles in the encapsulant may be initially unaligned when the encapsulant is deposited in dissolved, liquid, or other viscous form. After depositing the encapsulant, a magnetic field is applied to align the magnetic particles into a conductive path. The encapsulant may then be hardened in order to maintain the alignment of the magnetic particles and preserve conductive pathways. The resulting structure has anisotropic conductivity, such that electricity can flow along the aligned particle paths but not between adjacent aligned particle paths.

The anisotropic conductivity of the encapsulant provides various advantages. For example, a same layer of encapsulant may be deposited over multiple parallel lines of liquid metal conductor without shorting the lines to one another. Further, external components can be connected by aligning the correct pins, pads, or other connectors with the corresponding liquid metal interconnect traces and then contacted against the encapsulant. In this instance, the anisotropic nature of the magnetically aligned conductive pathways prevent pin-to-pin shorting while allowing electric current to flow between corresponding interconnect traces and pins. Such pins may be pushed into the encapsulant to a partial depth without posing a risk of leakage of liquid metal. Further, the alignment of the magnetic particles also may prevent unintentional conductive pathways from forming due to flexing of the interconnect.

Figure 1A:
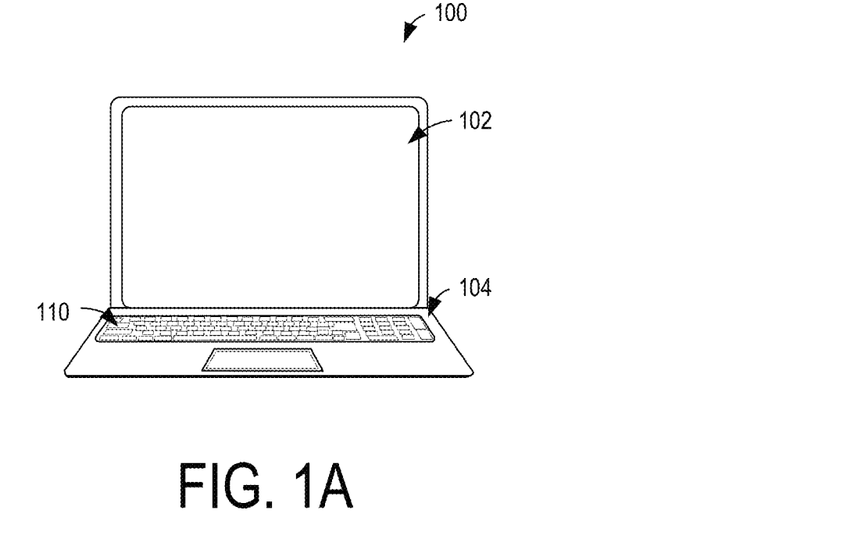
FIG. 1A shows a front view of an example computing system.
Figure 1B:
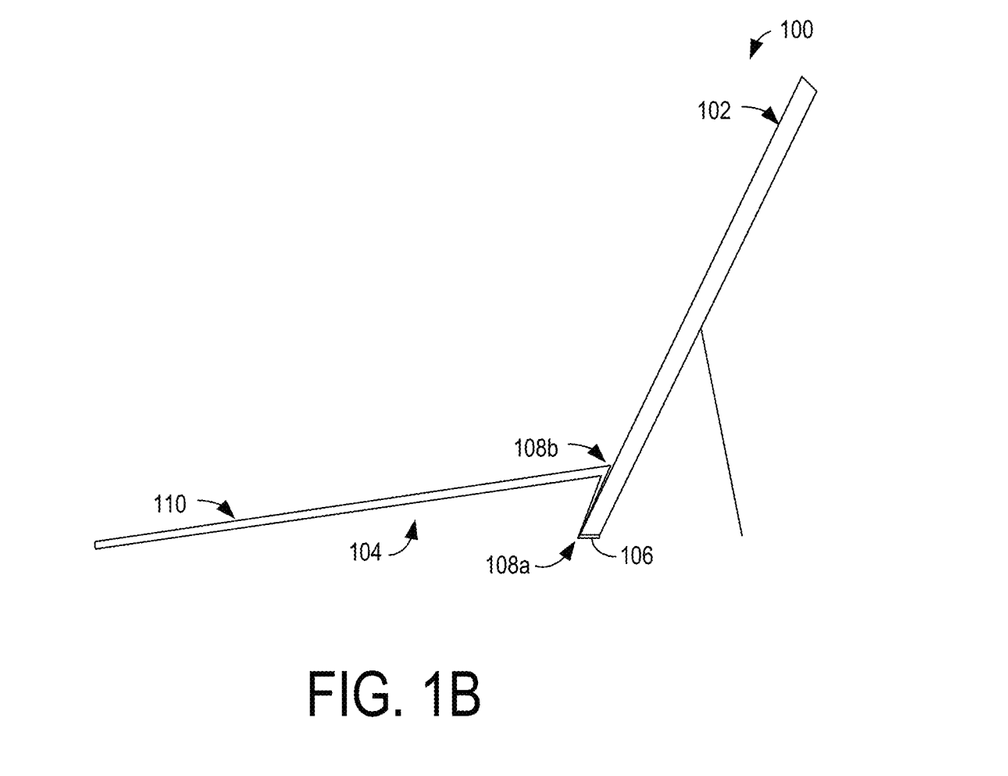
FIG. 1B shows a side view of the example computing system of FIG. 1A.
Figure 1C:
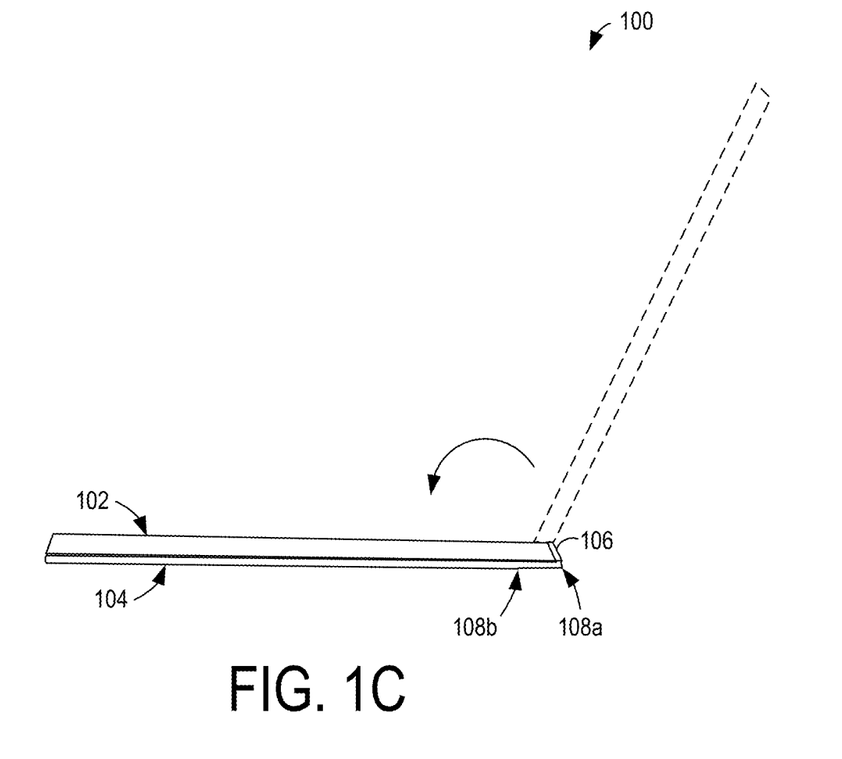
FIG. 1C shows a side view of the example computing system of FIG. 1A in a closed state.

FIGS. 1A-1C show an example computing system 100 in the form of a tablet having a display 102. The computing system is connected to a detachable keyboard unit 104 via a connector 106. The keyboard unit 104 comprises a flexible interconnect that electrically connects keys 110 and other electrical components of the keyboard unit 104 to the computing system 100 via the connector 106.

The keyboard unit 104 and the flexible interconnect positioned therein bend around a bottom corner of the display to a front of the display 102 in a first flex region 108a. As illustrated, the bend in this region is relatively sharp, conforming closely to the corner of the computing system 100. The keyboard unit 104 continues up the front surface of the display, and bends sharply down and away from the front surface of the display in a second flex region 108b. The bend in this region is also sharp. FIG. 1C shows flex region 108b in a straightened configuration when the computing device 100 and keyboard unit 104 are in a "closed" position, as opposed to an "open" position shown in FIGS. 1A-1B. Flex region 108a also may be straightened in a similar manner, for example, when the keyboard unit 104 is removed from the computing device. In other examples, an electronic device that utilizes a flexible interconnect may take any other suitable form.

As the keyboard unit potentially may be moved between the "open" and "closed" positions, as well as other possible positions, multiple times a day for potentially years of use, the flex regions 108a-b may flex a very large number of cycles during the device lifetime. Thus, a flexible interconnect having a liquid metal may be used to help prevent loss of conductivity in the event that a solid conductor in the trace is broken from fatigue.

Figure 2:
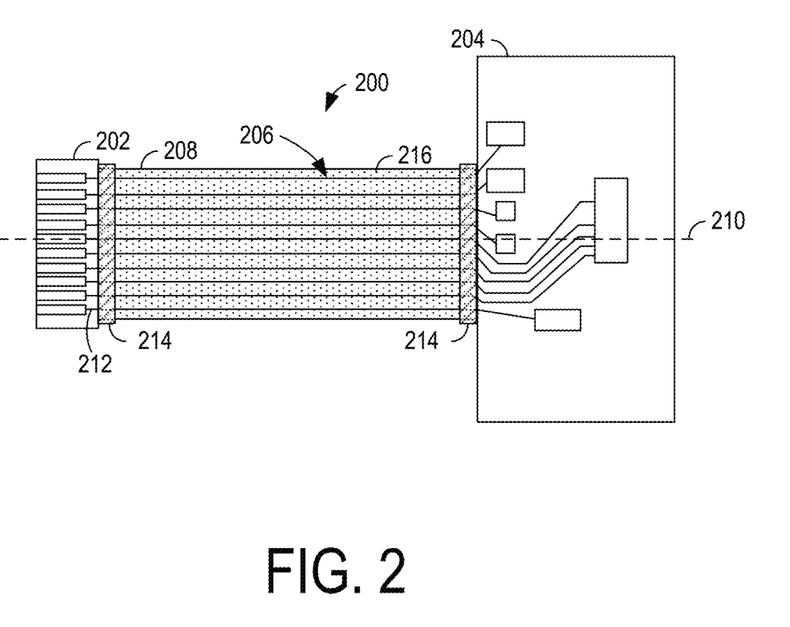
FIG. 2 shows a schematic view of an example flexible interconnect extending between two electrical components.

FIG. 2 shows an example flexible circuit element, in the form of flexible interconnect 200, that may be utilized to provide signal paths in a portion of a device configured to provide a movable or flexible joint, such as the flex regions described above for computing device 100. The interconnect 200 includes a plurality of conductive pathways 206 disposed on a flexible substrate 208, and extends between a first electrical component 202 in the form of a connector and a second electrical component 204 in the form of a circuit board having various electronic elements. In other examples, components 202 and 204 may take any suitable form, such as an integrated circuit. A longitudinal axis 210 is shown for reference.

The conductive pathways 206 comprise a liquid metal conductor disposed on the flexible substrate 208. Liquid metal can flow to fill the shape of a channel that holds the liquid metal, and therefore is not subject to the fatigue and breakage issues of solid metal traces when repeatedly bent. In various examples, the liquid metal may be used in place of a solid conductor, or may be used in addition to the solid conductor to provide self-healing capabilities for a solid metal trace when the solid metal trace breaks. As used herein, liquid metals may be defined as pure metals or metal alloys with a sufficiently low melting point (Tm) to be in a liquid state at room temperature. Non-limiting examples include eutectic gallium/indium (eGaIn), other gallium/indium alloys, eutectic gallium/indium/tin (Galinstan), and other gallium alloys. Solid conductors may be defined as electrical conductors having a Tm that is sufficiently above room temperature (e.g., higher than the Tm of liquid metals/conductors), such that the solid metal/conductor is solid at room temperature and at ordinary device operating temperatures.

The first electrical component 202 and/or the second electrical component 204 may include one or more pins or other interfaces (e.g., pin 212) for coupling to the conductive pathways of the interconnect 200. In order to provide an electrical path between the electrical components and the conductive pathways 206 of the interconnect, an encapsulant 214 comprising magnetically aligned conductive particles may be formed over at least a portion of the liquid metal conductive pathways 206. In the illustrated example, the encapsulant 214 is positioned at terminal regions of the conductive pathways, such that a middle region of the conductive pathways is not encapsulated by the encapsulant 214 with the magnetically aligned particles, but instead by an encapsulant 216 without such particles. In other examples, the encapsulant 214 comprising the magnetically aligned conductive particles may be formed over the full length of the conductive pathways.

Figure 3:
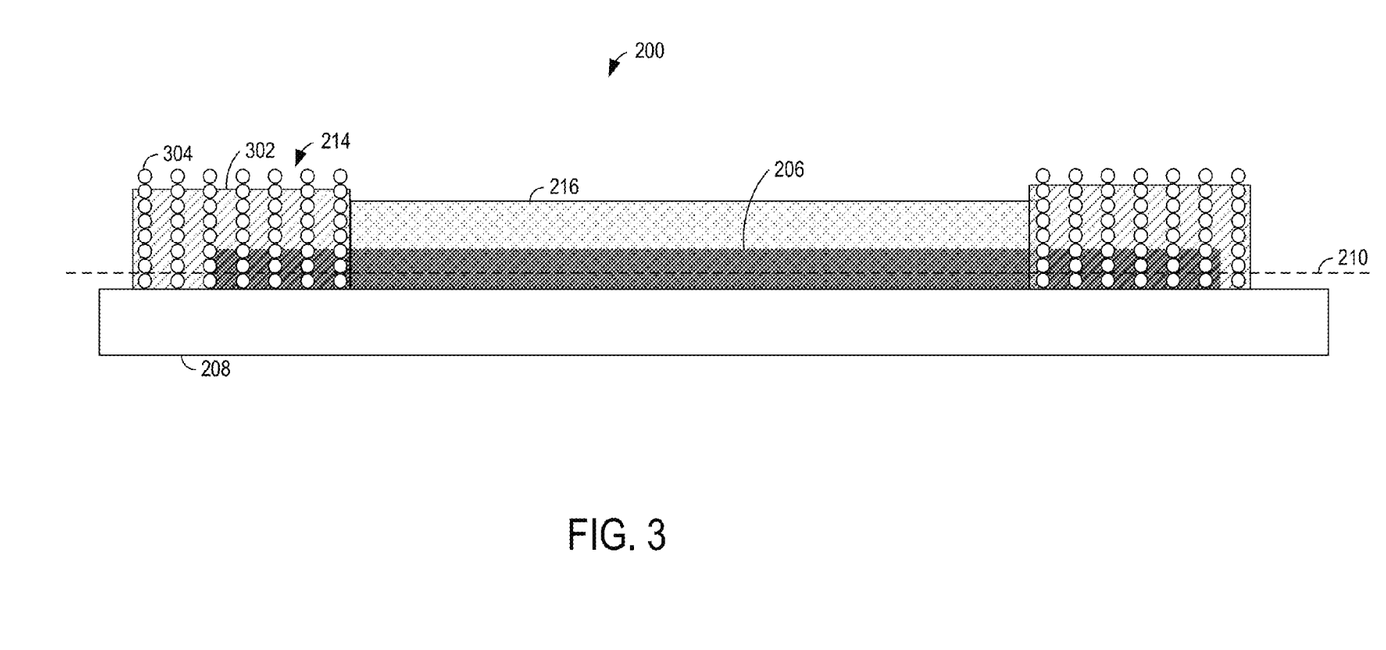
FIG. 3 shows a cross-sectional schematic view of an example flexible interconnect.

FIG. 3 shows a sectional view of a portion of the example flexible interconnect 200 of FIG. 2. The substrate 208 may be formed from any suitable electrically insulating, flexible material. In some examples, the substrate 208 is formed from a substantially non-stretchable material, while in other examples a stretchable material may be used, depending upon the device and joint in which the interconnect 200 is to be used. Examples of suitable materials include, but are not limited to, woven and non-woven fabrics, silicone polymers, flexible plastics, and other polymers (e.g. polyimides, polyethylene terephthalate [PET], polyurethanes, and acrylics). Further, in some examples, a composite substrate may be used, such as a fabric embedded with or coated with a polymer.

In this example, the liquid metal conductor 206 is in contact with the substrate 208, but other layers may be positioned between these layers, such as a solid metal conductive trace layer. Any suitable liquid metal may be used that remains in a liquid phase within intended device operating temperature ranges. Examples include, but are not limited to, various alloys of gallium, such as indium/gallium and indium/gallium/tin alloys. The liquid metal 206 may be incorporated into the interconnect 200 in any desired manner. For example, an alloy of gallium may be deposited via a needle orifice or the like directly onto the substrate. The outer surface of such an alloy, when exposed to air, forms a thin oxide layer that prevents the liquid metal from spreading, and thus retains the shape in which the liquid metal is initially deposited. In other examples, the encapsulating layer 216 may first be applied over the substrate 208, then a channel formed between the substrate 208 and the encapsulating layer 216, and then the liquid metal introduced into the channel (e.g. by injection or pressure differentials). Other example deposition methods include electrochemically depositing the liquid metal from a bath, or spreading the liquid metal onto the solid metal trace, where selective wetting between the liquid metal and the substrate may constrain the shape of the liquid metal.

The encapsulating layer 216 helps to retain the liquid metal layer in a desired location, and electrically insulates the conductive pathways. In some examples, the encapsulating layer 216 may be formed at least partially from a silicone polymer, a polyimide, or another flexible, non-conductive polymer. The encapsulating layer may contact the substrate 208 in regions between conductive pathways 206. The encapsulating layer may be deposited in any suitable manner, depending upon the polymer used. For example, a thermoplastic polymer encapsulant may be deposited by heating, spreading over the pathways to be covered (whether prior to or after the addition of the liquid metal), and then cooling. As another example, a cross-linkable monomer or polymer may be cast onto the substrate and/or conductive pathways to be covered, and then cured. In yet another example, a pre-formed encapsulant film may be laminated to the substrate over the conductive pathways. Where the encapsulating layer is added prior to liquid metal inclusion, a channel may be formed at the interface of the substrate and the encapsulating layer after formation of the encapsulating layer, and the liquid metal then may be added to the channel.

The conductively anisotropic, magnetic particle-embedded encapsulant 214 may include a polymer 302 that is embedded with magnetic particles 304. The polymer 302 be formed from the same polymer material as encapsulant 216, or may be utilize one or more different materials. As discussed above, the polymer 302 may include an elastomer such as silicone, polyurethane or other members of the urethane family, thermoplastic (e.g., glycopolymer, polystyrene, ethylene butadiene), and/or other materials or composites having elastomeric qualities. The magnetic particles 304 may include ferromagnetic particles such as nickel or iron, and/or paramagnetic particles. In some examples, the magnetic particles 304 may include a magnetic core (e.g., iron, nickel, and/or other magnetic material(s) or compound(s)) coated with a conductive material (e.g., comprising copper, gold, silver, and/or other conductive material(s) or compound(s)). The particle sizes may range from 50-100 microns in some examples. In other examples, particles of any other suitable size and/or size dispersion may be used. Further, in some examples, a carbon-based filler may be added to the magnetic particle-embedded elastomer to further improve connection robustness. Adding carbon-based conductive filler to the magnetic particle-embedded elastomer may reduce the contact resistance at a connection area in systems where low contact resistance is beneficial. The carbon-based filler may include carbon black, graphite, carbon nanotube (single wall and/or multi-wall), and graphene, as non-limiting examples.

Figure 4:
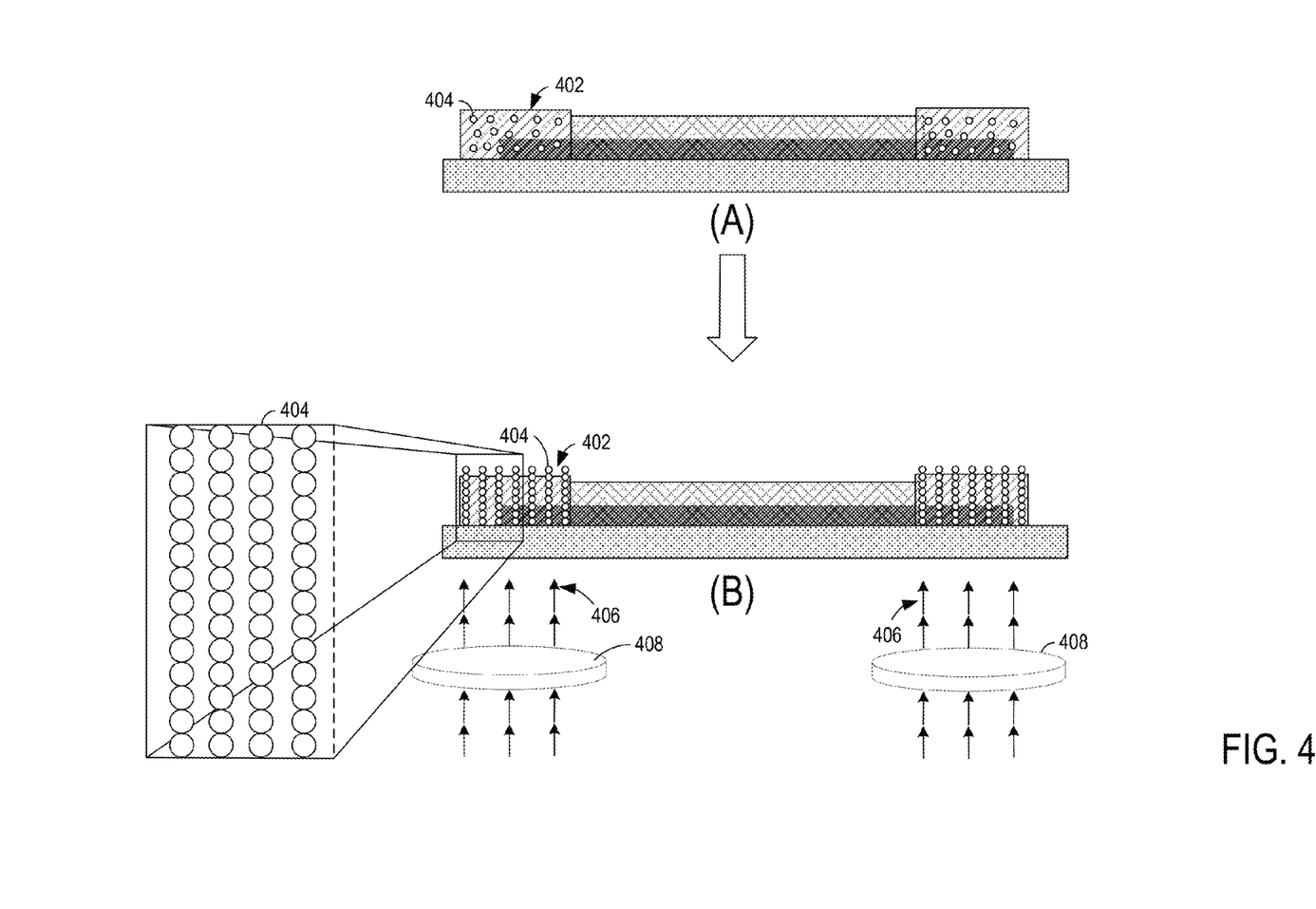
FIG. 4 shows a cross-sectional view of an example structure for a flexible interconnect in different states.

FIG. 4 illustrates a magnetic particle alignment process. Initially, as shown at state (A), the magnetic particles 404 are not aligned and are not in contact with one another. Instead, the magnetic particles are randomly distributed and do not form conductive pathways, as the particle density is too low to be conductive. State (B) of FIG. 4 is achieved by the application of a magnetic field 406 to the encapsulant 402. The magnetic field 406 may be applied via permanent magnets 408, or electromagnets. The application of the magnetic field 406 causes the magnetic particles 404 to align and contact one another to create conductive pathways in a z-direction, as illustrated. While the particles are held in alignment via the magnetic field, the encapsulant may be cured, dried via solvent removal, or otherwise hardened to fix the magnetic particles in the aligned state.

Figure 5:
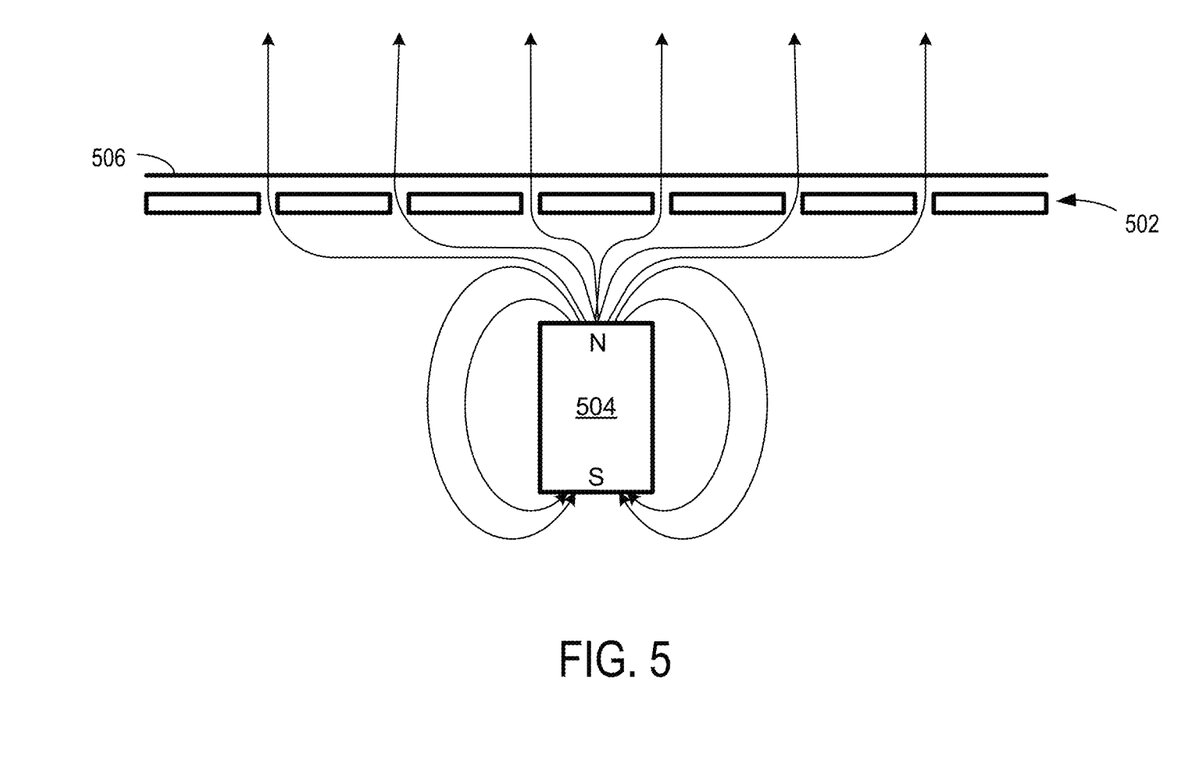
FIG. 5 shows an example encapsulant hardening process for aligning magnetic particles in an encapsulant.

In some examples, a spacing of aligned particle paths from one another may be controlled. FIG. 5 shows an example encapsulant hardening process for aligning magnetic particles to control spacing of aligned particles. In this example, a patterned magnetic shield 502 is positioned between permanent magnet 504 and substrate 506, to provide a plurality of dead zones in which no particles are aligned. In this arrangement, the particles within the polymer host material will align perpendicular to the substrate, spanning the thickness of the polymer host material. In other implementations, the magnetic shield may be omitted, and 'repulsion' of particles along the magnetic field lines may have the effect of aligning the particles along plural, non-intersecting paths through the host material.

Figure 6:
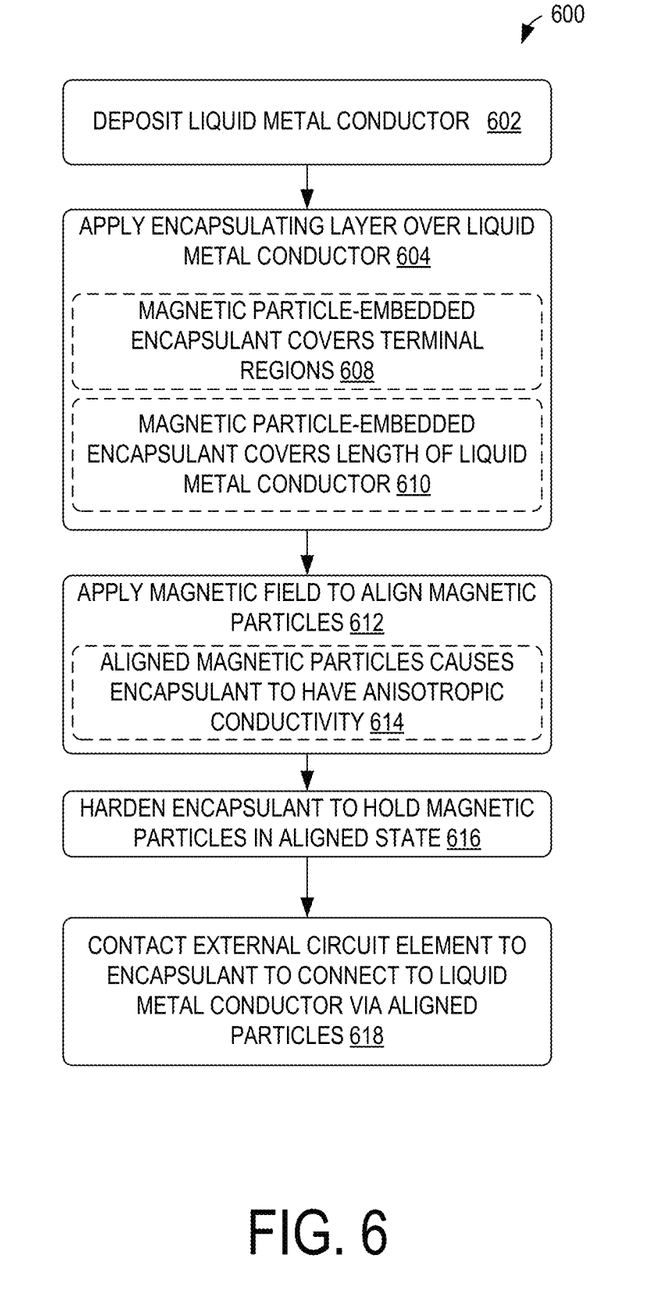
FIG. 6 shows a flow diagram depicting an example method for manufacturing a flexible circuit element.

FIG. 6 shows a flow chart illustrating an example method 600 for manufacturing a flexible circuit element. Method 600 may be utilized to manufacture interconnects 200 and 300 of FIGS. 2 and 3, or any other flexible circuit elements. At 602, method 600 includes depositing a liquid metal conductor to form a conductive path supported by a flexible substrate. The term "supported by the substrate" may be used to refer to the liquid metal conductor being either in direct contact with the substrate, or separated from the substrate by one or more intervening layers.

The liquid metal conductor may be deposited in any suitable manner. For example, the liquid metal conductor may be deposited via a syringe in order to form a bead/line of the liquid metal over the flexible substrate. In other examples, the liquid metal conductor may be deposited after formation of an encapsulating layer, for example by forming a microfluidic channel in the encapsulating layer and then introducing the liquid metal into the channel via vacuum or applied pressure. As another example, where the liquid metal is deposited over solid metal traces, a nip roller or doctor bar may be used to pull the liquid metal across the surface of the substrate. The liquid metal may wet the solid traces and thus be deposited on the solid traces, while not wetting the substrate surface. In such examples, the solid traces may be treated with an acid, base, or reducing agent to remove surface oxides prior to liquid metal deposition. Other examples of forming the liquid metal layer include electroplating, stencil lithography, evaporation utilizing a shadow mask for patterning, inkjet printing liquid metal in a volatile carrier solvent, and screen printing liquid metal (possibly with additives depending upon the liquid metal used).

Method 600 further includes, at 604, forming an encapsulating layer to encapsulate the liquid metal and hold the liquid metal in a desired location. As described above, at least a portion of the encapsulating layer(s) includes a magnetic particle-embedded encapsulant. The encapsulating layer may be formed in any suitable manner, including but not limited to via casting, molding and laminating processes. In some examples, multiple layers of liquid metal conductors and encapsulant may be formed to manufacture a multi-layered conductive trace, wherein each layer of encapsulant can act as a substrate for a next solid/liquid metal trace layer.

The encapsulant may be applied while in a liquid, dissolved, or other viscous state and the embedded magnetic particles are not aligned. As indicated at 608, in some examples, the magnetic particle-embedded encapsulant may be positioned in terminal regions of the liquid metal conductor, as illustrated at 214 in FIGS. 2 and 3. In such examples, an encapsulant without magnetic particles may be used to cover a central portion of the liquid metal conductor, as illustrated at 216 in FIGS. 2 and 3). The different encapsulant regions may be formed in any suitable order, and may be formed from similar or different encapsulant materials. In other examples, the magnetic particle-embedded encapsulant may cover substantially the entire length of the liquid metal conductor, as indicated at 610. Likewise, in other examples, the encapsulant may be formed (by deposition, magnetic particle alignment, and hardening) prior to application to the substrate, and then laminated onto the substrate.

At 612, method 600 includes applying a magnetic field to align the magnetic particles in the encapsulant. The alignment of the magnetic particles may cause the encapsulant to have anisotropic conductivity. The conductivity of the encapsulant per unit area or volume may depend on the magnetic field applied during alignment. For example, application of a stronger magnetic field may increase a packing density of the particles of the encapsulant, thereby increasing the density of conductors of the encapsulant, where the encapsulant has sufficient particle loading. Further, as described above with regard to FIG. 5, a patterning mechanism may be used in some examples to form conductive paths with the magnetic particles at desired locations.

At 616, method 600 includes hardening the encapsulant while the magnetic field is applied to hold the magnetic particles in the aligned state. For example, the encapsulant may be cured and/or otherwise solidified by any suitable mechanism. Thermal and/or photochemical curing may be employed in some examples. In other examples, a molten thermoplastic host material may be cooled to effect solidification, or volatile solvent may be evaporated. The resulting anisotropic conductivity of the encapsulant forms conductive paths extending from the liquid metal conductor. Method 600 further comprises, at 618, contacting an external circuit element to the encapsulant having the aligned magnetic particles to connect the external circuit element to the liquid metal conductor.

The examples disclosed herein may provide increased protection against signal path breakages compared to configurations that use only solid metal traces. Furthermore, the use of a conductively anisotropic, magnetic particle-embedded encapsulant in at least interfacing regions of liquid metal conductive pathways enables conductive pathways to be reliably coupled to rigid or semi-rigid external components and protects against circuit shorting and disconnection during flexing of the liquid metal conductors.

Another example provides an interconnect including a substrate, a liquid conductive pathway supported by the substrate, and a conductively anisotropic, magnetic particle-embedded encapsulant that interfaces with the liquid conductive pathway for connecting to another circuit element. In such an example, the magnetic particle-embedded encapsulant may additionally or alternatively be positioned at one or more terminal regions of the liquid conductive pathway, and the interconnect may additionally or alternatively further include an encapsulant that is not embedded with magnetic particles positioned in a central region of the liquid conductive pathway. In such an example, the encapsulant may additionally or alternatively be formed over the full length of the liquid conductive pathway. In such an example, the encapsulant may additionally or alternatively include magnetic particles embedded in an elastomeric polymer. In such an example, the elastomeric polymer may additionally or alternatively include one or more of a silicone, a polyurethane, and a thermoplastic material. In such an example, the magnetic particles may additionally or alternatively include ferromagnetic particles. In such an example, the magnetic particles may additionally or alternatively include paramagnetic particles. In such an example, the magnetic particles may additionally or alternatively include nickel. In such an example, the magnetic particles may additionally or alternatively include magnetic cores coated with a conductor. In such an example, the conductive cores may additionally or alternatively include one or more of gold, silver, and copper. Any or all of the above-described examples may be combined in any suitable manner in various implementations.

Another example provides for a method of manufacturing an interconnect, the method including depositing a liquid metal conductor to form a conductive path along a flexible substrate, applying an encapsulating layer over at least a portion of the liquid metal conductor, the encapsulating layer including a magnetic particle-embedded encapsulant, applying a magnetic field to the encapsulating layer to align the magnetic particles and cause the magnetic particle-embedded encapsulant to have anisotropic conductivity, and hardening the magnetic particle-embedded encapsulant to hold the magnetic particles in an aligned state. In such an example, the magnetic particle-embedded encapsulant may additionally or alternatively include an elastomeric polymer embedded with the magnetic particles. In such an example, the magnetic particle-embedded encapsulant may additionally or alternatively be applied over at least the portion of the liquid metal conductor while the elastomeric polymer is in a viscous state and the magnetic particles are unaligned. In such an example, applying the encapsulating layer may additionally or alternatively include applying the magnetic particle-embedded encapsulant over terminal regions of the liquid metal conductor and applying an encapsulant that does not include magnetic particles over a central region of the liquid metal conductor. In such an example, the liquid metal conductor may additionally or alternatively be one of a plurality of liquid metal conductors deposited on the flexible substrate forming a plurality of conductive paths. In such an example, applying the encapsulating layer over at least the portion of the liquid metal conductor may additionally or alternatively include applying the encapsulating layer over the plurality of liquid metal conductors such that the encapsulating layer contacts the flexible substrate between adjacent liquid metal conductors. Any or all of the above-described examples may be combined in any suitable manner in various implementations.

Another example provides for a device including a first circuit element, a second circuit element, and an interconnect between the first circuit element and the second circuit element, the interconnect including a liquid conductive pathway, and a conductively anisotropic, magnetic particle-embedded encapsulant that interfaces with the liquid conductive pathway between the liquid conductive pathway and one or more of the first circuit element and the second circuit element. In such an example, one or more of the first circuit element and the second element may additionally or alternatively include a printed circuit board or an integrated circuit element. In such an example, the encapsulant may additionally or alternatively include magnetic particles embedded in an elastomeric polymer, the elastomeric polymer may additionally or alternatively include one or more of a silicone, a polyurethane, and a thermoplastic material, and the magnetic particles may additionally or alternatively include one or more of ferromagnetic particles and ferromagnetic-coated particles. In such an example, the encapsulant may additionally or alternatively further include a carbon-based filler. Any or all of the above-described examples may be combined in any suitable manner in various implementations.

It will be understood that the configurations and/or approaches described herein are presented for the purpose of example, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An interconnect comprising: a substrate; a liquid conductive pathway supported by the substrate; a conductively anisotropic, magnetic particle-embedded encapsulant that interfaces with the liquid conductive pathway for connecting to another circuit element, the magnetic particle-embedded encapsulant being positioned at one or more terminal regions of the liquid conductive pathway; and an encapsulant that is not embedded with conductively anisotropic magnetic particles positioned in a central region of the liquid conductive pathway.

2. The interconnect of claim 1, wherein the encapsulant is formed over the full length of the liquid conductive pathway.

3. The interconnect of claim 1, wherein the encapsulant includes magnetic particles embedded in an elastomeric polymer.

4. The interconnect of claim 3, wherein the elastomeric polymer includes one or more of a silicone, a polyurethane, and a thermoplastic material.

5. The interconnect of claim 3, wherein the magnetic particles include ferromagnetic particles.

6. The interconnect of claim 3, wherein the magnetic particles include paramagnetic particles.

7. The interconnect of claim 3, wherein the magnetic particles include nickel.

8. The interconnect of claim 3, wherein the magnetic particles include magnetic cores coated with a conductor.

9. The interconnect of claim 8, wherein the conductive cores include one or more of gold, silver, and copper.

10. A method of manufacturing an interconnect, the method comprising: depositing a liquid metal conductor to form a conductive path along a flexible substrate; applying an encapsulating layer over at least a portion of the liquid metal conductor, the encapsulating layer including a magnetic particle-embedded encapsulant applied over one or more terminal regions of the liquid metal conductor and an encapsulant that does not comprise magnetic particles over a central region of the liquid metal conductor; applying a magnetic field to the encapsulating layer to align the magnetic particles and cause the magnetic particle-embedded encapsulant to have anisotropic conductivity; and hardening the magnetic particle-embedded encapsulant to hold the magnetic particles in an aligned state.

11. The method of claim 10, wherein the magnetic particle-embedded encapsulant comprises an elastomeric polymer embedded with the magnetic particles.

12. The method of claim 11, wherein the magnetic particle-embedded encapsulant is applied over at least the portion of the liquid metal conductor while the elastomeric polymer is in a viscous state and the magnetic particles are unaligned.

13. The method of claim 10, wherein the liquid metal conductor is one of a plurality of liquid metal conductors deposited on the flexible substrate forming a plurality of conductive paths.

14. The method of claim 13, wherein applying the encapsulating layer over at least the portion of the liquid metal conductor includes applying the encapsulating layer over the plurality of liquid metal conductors such that the encapsulating layer contacts the flexible substrate between adjacent liquid metal conductors.

15. A device comprising: a first circuit element; a second circuit element; and an interconnect between the first circuit element and the second circuit element, the interconnect comprising, a liquid conductive pathway, a conductively anisotropic, magnetic particle-embedded encapsulant that interfaces with the liquid conductive pathway at one or more terminal regions between the liquid conductive pathway and one or more of the first circuit element and the second circuit element, and an encapsulant that is not embedded with conductively anisotropic magnetic particles positioned in a central region of the liquid conductive pathway.

16. The device of claim 15, wherein one or more of the first circuit element and the second element comprises a printed circuit board or an integrated circuit element.

17. The device of claim 15, wherein the encapsulant includes magnetic particles embedded in an elastomeric polymer, the elastomeric polymer including one or more of a silicone, a polyurethane, and a thermoplastic material, and the magnetic particles including one or more of ferromagnetic particles and ferromagnetic-coated particles.

18. The device of claim 15, wherein the encapsulant further includes a carbon-based filler.

* * * * *